(12) United States Patent
Hatakeyama

(10) Patent No.: US 7,936,056 B2
(45) Date of Patent: May 3, 2011

(54) AIRTIGHT PACKAGE COMPRISING A PRESSURE ADJUSTMENT UNIT

(75) Inventor: Tomoyuki Hatakeyama, Hachioji (JP)

(73) Assignee: Olympus Corporation, Tokyo (JP)

( * ) Notice: Subject to any disclaimer, the term of this patent is extended or adjusted under 35 U.S.C. 154(b) by 626 days.

(21) Appl. No.: 12/018,615

(22) Filed: Jan. 23, 2008

(65) Prior Publication Data

US 2008/0211073 A1 Sep. 4, 2008

(30) Foreign Application Priority Data

Jan. 25, 2007 (JP) .................................. 2007-015152

(51) Int. Cl.
*H01L 23/20* (2006.01)

(52) U.S. Cl. ........ 257/682; 257/683; 257/687; 257/710; 257/717; 257/721; 257/E23.182; 257/E23.183; 257/E23.188

(58) Field of Classification Search .................. 257/682, 257/683, 687, 710, 717, 721, E23.182, E23.183, 257/E23.188

See application file for complete search history.

(56) References Cited

U.S. PATENT DOCUMENTS

| 7,042,075 B2* | 5/2006 | Liebeskind | 257/682 |
| 2002/0043706 A1* | 4/2002 | Jerominek et al. | 257/680 |
| 2007/0065295 A1* | 3/2007 | Moraja et al. | 417/48 |

FOREIGN PATENT DOCUMENTS

JP 2004-160648 6/2004

* cited by examiner

*Primary Examiner* — Matthew E Warren
*Assistant Examiner* — David Z Chen
(74) *Attorney, Agent, or Firm* — Scully, Scott, Murphy & Presser, P.C.

(57) ABSTRACT

An airtight sealed package with a device sealed therein in an airtight manner under vacuum, the device being placed in a space defined in the airtight sealed package by a lid and a substrate, includes at least one pressure adjustment unit provided on at least one of the lid and the substrate, and configured to receive energy from an outside of the airtight sealed package, with the device sealed in the airtight manner in the airtight sealed package, to adjust pressure in the space. An energy transmission member transmits the energy to the pressure adjustment unit.

2 Claims, 5 Drawing Sheets

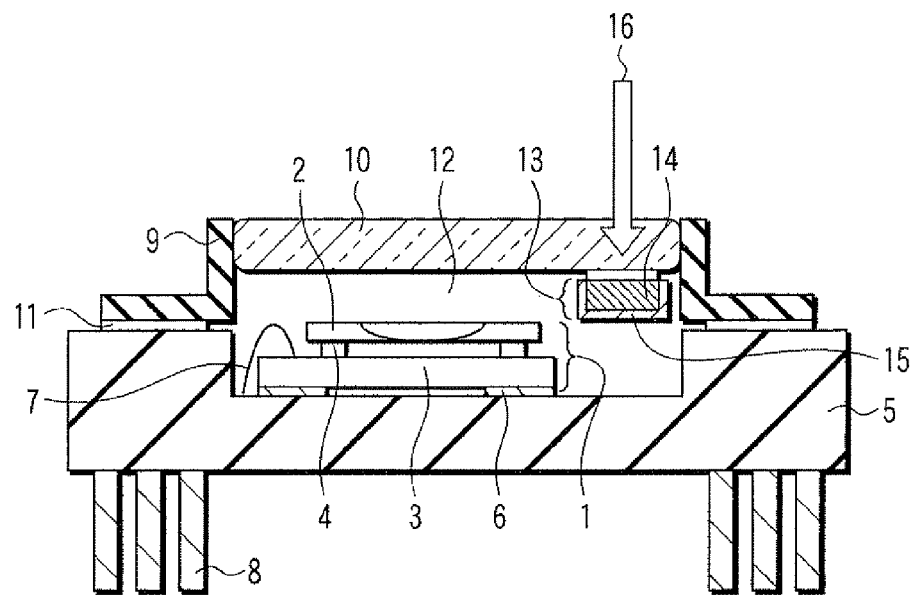
F I G. 1
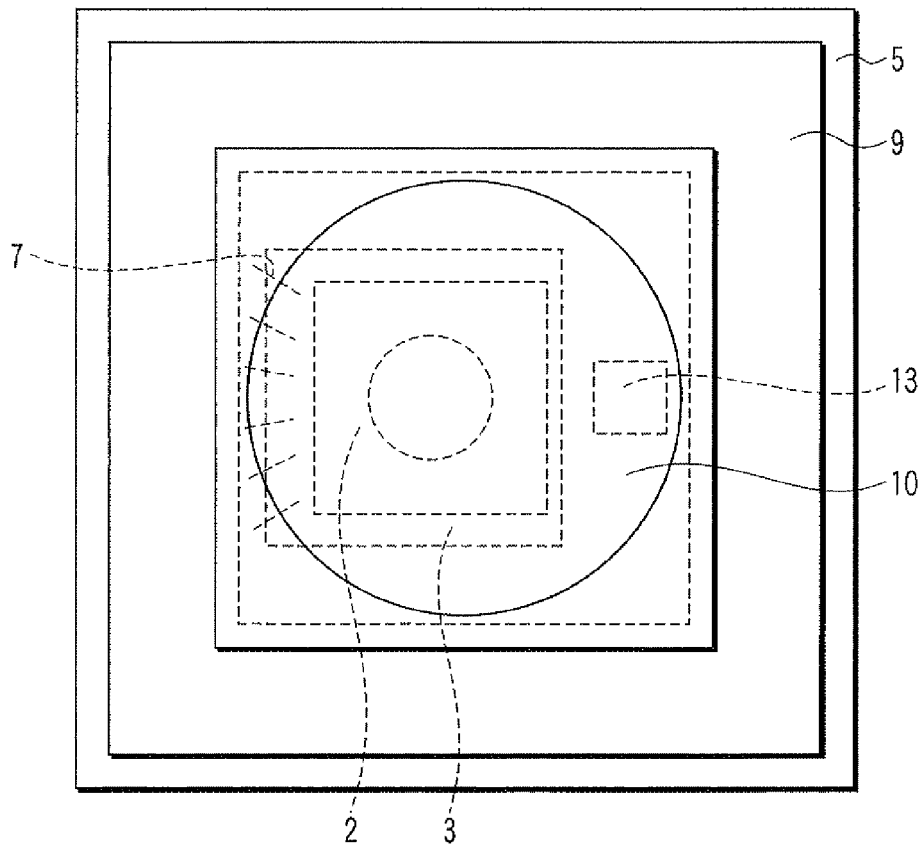
F I G. 2

US 7,936,056 B2

AIRTIGHT PACKAGE COMPRISING A PRESSURE ADJUSTMENT UNIT

CROSS-REFERENCE TO RELATED APPLICATIONS

This application is based upon and claims the benefit of priority from prior Japanese Patent Application No. 2007-015152, filed Jan. 25, 2007, the entire contents of which are incorporated herein by reference.

BACKGROUND OF THE INVENTION

1. Field of the Invention

The present invention relates to an airtight package for sealing a device, such as a MEMS, in an airtight manner under vacuum pressure.

2. Description of the Related Art

Jpn. Pat. Appln. KOKAI Publication No. 2004-160648, for example, has proposed a package for sealing a device, such as a micro electro mechanical system (MEMS), in an airtight manner, and a sealing method for the package. The technique of Jpn. Pat. Appln. KOKAI Publication No. 2004-160648 will now be described briefly with reference to FIG. 11.

In FIG. 11, a semiconductor substrate 130 with a large number of MEMSs formed thereon, and a lid member 110 formed of glass with a getter attached to cavity are opposed to each other in a vacuum chamber 120. Subsequently, an inactive gas is supplied into the vacuum chamber 120 through a gas introducing section 140 communicating therewith. At this time, the gas introducing section 140 and a gas exhausting section 150 are controlled so that the vacuum chamber 120 can be kept at a preset vacuum degree. After the vacuum chamber 120 is reliably set at the vacuum degree, a high voltage is applied to the lid member 110 while the lid member 110 is heated, thereby bonding the lid member 110 to the semiconductor substrate 130.

This airtight sealing method enables the degree of vacuum to be adjusted to a desired value, and is superior in that an initial degree of vacuum can be maintained even after a preset time elapses.

BRIEF SUMMARY OF THE INVENTION

According to a first aspect of the present invention, there is provided an airtight sealed package with a device sealed therein in an airtight manner under vacuum, the device being placed in a space defined in the airtight sealed package by a lid and a substrate, comprising: at least one pressure adjustment unit provided on at least one of the lid and the substrate, and configured to receive energy from an outside of the airtight sealed package, with the device sealed in the airtight manner in the airtight sealed package, to adjust pressure in the space; and an energy transmission member which transmits the energy to the pressure adjustment unit.

Advantages of the invention will be set forth in the description which follows, and in part will be obvious from the description, or may be learned by practice of the invention. Advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

FIG. 1 is a sectional view illustrating the state of an airtight sealed package according to a first embodiment of the invention, which is assumed before pressure adjustment;

FIG. 2 is a perspective view illustrating the airtight sealed package of the first embodiment;

DETAILED DESCRIPTION OF THE INVENTION

First Embodiment

Figure 3:
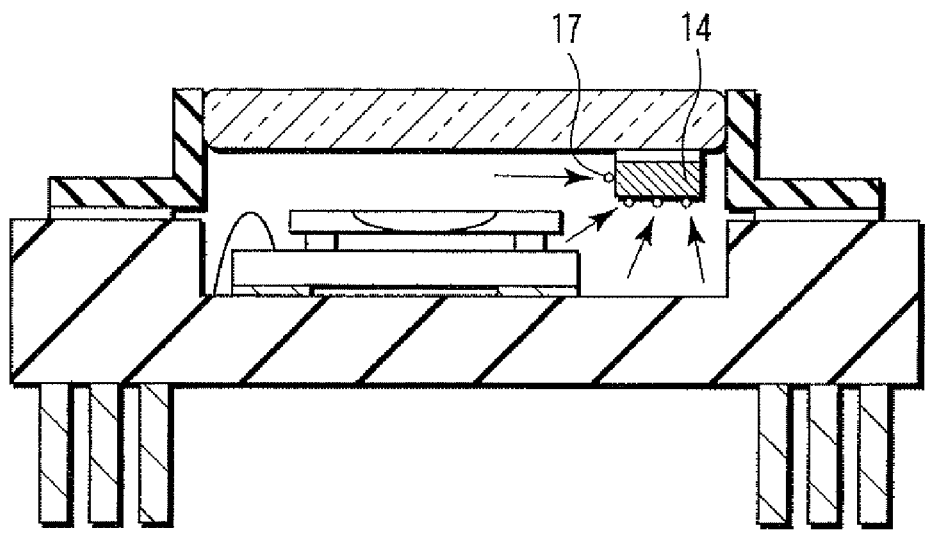
FIG. 3 is a sectional view illustrating the state of the airtight sealed package of the first embodiment, which is assumed during pressure adjustment.

Referring to FIGS. 1 to 3, an airtight sealed package according to a first embodiment of the invention will now be described. FIG. 1 is a sectional view illustrating the state of the airtight sealed package of the first embodiment, which is assumed before pressure adjustment. FIG. 2 is a perspective view illustrating the airtight sealed package of the first embodiment. FIG. 3 is a sectional view illustrating the state of the airtight sealed package of the first embodiment, which is assumed during pressure adjustment.

(Structure)

Referring first to FIGS. 1 and 2, a description will be given of the structure of the airtight sealed package of the first embodiment.

As shown in FIG. 1, a MEMS device 1 sealed by an airtight sealed package includes a MEMS chip 2 that has a mechanical driving section and an electrode substrate 3 with driving electrodes (not shown). The MEMS chip 2 and electrode substrate 3 are electrically and mechanically coupled to each other, with a preset gap defined therebetween by spacers 4 as metal bumps. The MEMS device 1 is fixed to the bottom of a package substrate 5 by a bonding member 6 formed of, for example, solder. The driving electrodes of the electrode substrate 3 are electrically connected by a bonding wire 7 to electrodes (not shown) contained in the package substrate 5. The bonding wire 7 is electrically connected via pins 8 to a circuit (not shown) outside the airtight sealing device.

As shown in FIGS. 1 and 3, the lid 9 has an optical window 10 formed therein for permitting light to pass therethrough. The package substrate 5 and lid 9 are coupled to each other via seal members 11 formed of solder or low-fusion-point glass.

As a result, the sealed internal space 12 formed between the package substrate 5 and lid 9 is kept at a desired degree of vacuum.

A pressure adjustment unit 13 is provided on the surface of the optical window 10 that defines the sealed internal space 12. The pressure adjustment unit 13 is formed by coating a quadratic prism member of a metal, such as a solder alloy 14, containing no air-producing components, with an inactive metal film 15 such as an Au film. It is desirable that the solder alloy 14 should have an Sn-based composition that contains Pb, Zn, Al and/or Sb and is liable to form an oxide.

The pressure adjustment unit 13 can be formed into an arbitrary shape in accordance with the adjusted degree of vacuum (pressure), and hence is not limited to the quadratic prism shape. Further, a plurality of pressure adjustment units 13 may be provided in accordance with the adjusted degree of vacuum. Furthermore, although in the embodiment, the pressure adjustment unit 13 is provided on the optical window 10, it may not always be provided thereon. It is sufficient if a laser beam 16 can be applied to the pressure adjustment unit 13 from the outside. For instance, the pressure adjustment unit 13 may be provided on the package substrate 5 or MEMS device 1.

(Function)

Referring then to FIG. 3, the pressure adjustment function of the first embodiment will be described.

Firstly, the package of the first embodiment is sealed in an airtight manner using an airtight sealing device (not shown) that can adjust the interior of the package to a desired degree of vacuum, whereby the internal space 12 of the package is sealed at a desired degree of vacuum. Thus, the airtight sealed package is produced.

If a small amount of gas (mainly, air) is introduced from the outside into the sealed internal space 12 because of a reduction in the airtightness of the periphery of the optical window 10 or seal member 11, the pressure in the sealed internal space 12 is increased to thereby change the driving performance of the MEMS device 1.

In this case, a laser beam 16 is applied from the outside to the pressure adjustment unit 13 through the optical window 10 to supply thermal energy thereto, with the result that the inactive metal film 15 diffuses into the solder alloy 14 and the solder alloy 14 is exposed to the internal space 12 through the film. As this time, as shown in FIG. 3, the exposed solder alloy 14 reacts with gas molecules 17 of oxygen and moisture introduced into the internal space 12 to thereby form an oxide film, or the solder alloy 14 absorbs the gas molecules 17. Accordingly, the number of gas molecules 17 decreases to thereby decrease the pressure. The decrease of the pressure can be adjusted by adjusting the intensity and/or time of application of the laser beam 16, and/or the surface area of the pressure adjustment unit 13. For instance, the amount of energy supplied to the pressure adjustment unit 13 is increased if the intensity or time of application of the laser beam 16 is increased. This accelerates the rate of reaction, thereby decreasing the pressure. Further, when the same amount of energy is supplied, the amount of reaction is increased to thereby decrease the pressure if the surface area of the pressure adjustment unit 13 is increased. Thus, the vacuum degree of the sealed internal space 12 can be returned to a desired value by adjusting the intensity and/or time of application of the laser beam 16, and/or the surface area of the pressure adjustment unit 13.

(Advantages)

As described above, in the first embodiment, even if the sealed internal space 12 of the airtight sealed package is not filled with an inactive gas, such as Ar gas, the degree of vacuum (pressure) of the sealed internal space can be set at a desired value. Further, during pressure adjustment, energy can be supplied only to the pressure adjustment unit 13, and therefore pressure adjustment can be achieved even if a MEMS device having a low thermal resistance is contained in the package.

Also, in the first embodiment, to supply energy for pressure adjustment to the pressure adjustment unit 13 by applying a laser beam 16 thereto through the optical window 10, it is not necessary to employ a new energy transmission member, which can hold down the manufacturing cost of the package.

In addition, since the pressure adjustment unit 13 is formed of the cheap solder alloy 14, the manufacturing cost of the pressure adjustment unit 13 can be held down. Compared to the other embodiments described later, the first embodiment has a simple structure and hence can be produced at low cost. Furthermore, since the solder alloy 14 of the pressure adjustment unit 13 is coated with the inactive metal film 15 formed of, for example, Au, the solder alloy 14 is normally prevented from reacting with gas molecules 17, which means that reduction of pressure does not normally occur.

Second Embodiment

Figure 4:
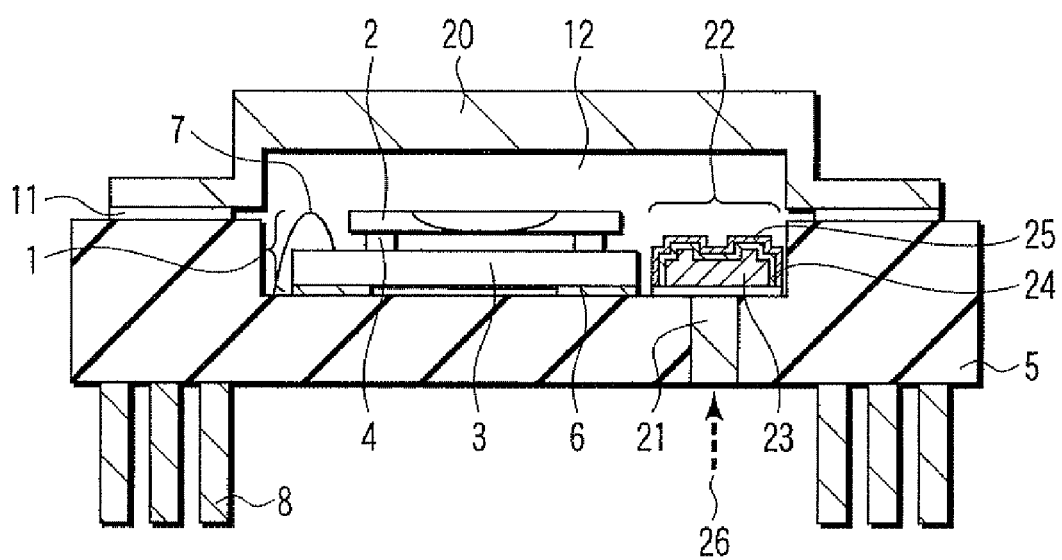
FIG. 4 is a sectional view illustrating the state of an airtight sealed package according to a second embodiment of the invention, which is assumed before pressure adjustment.
Figure 5:
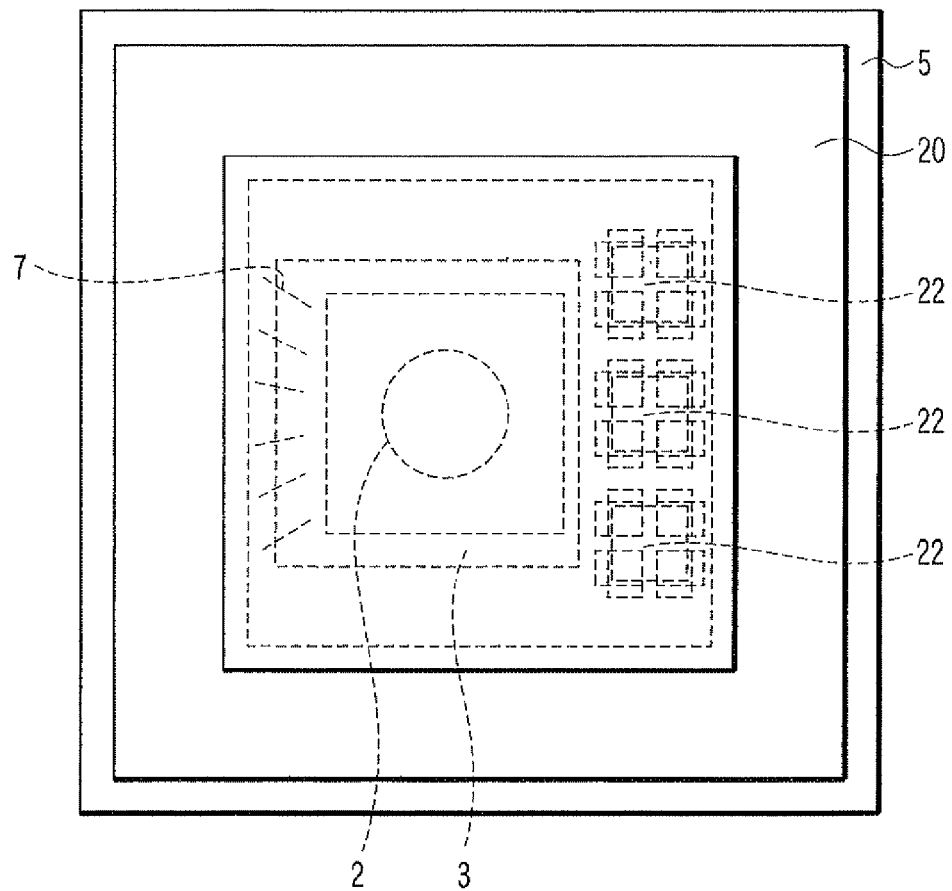
FIG. 5 is a perspective view illustrating the airtight sealed package of the second embodiment.
Figure 6:
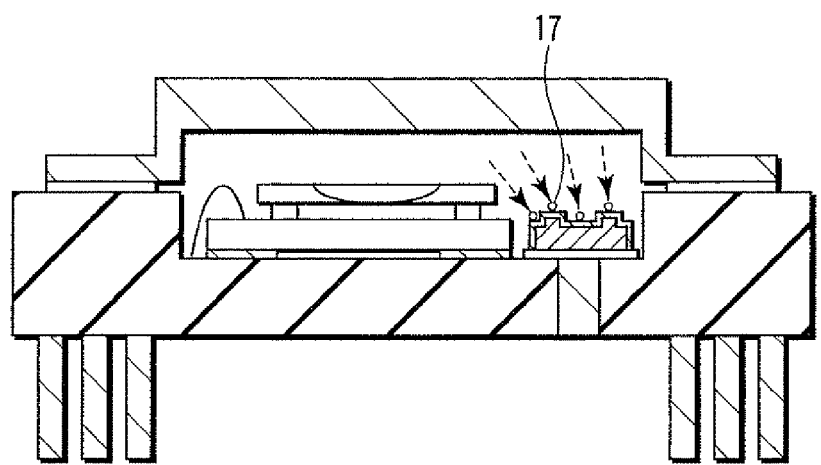
FIG. 6 is a sectional view illustrating the state of the airtight sealed package of the second embodiment, which is assumed during pressure adjustment.

Referring then to FIGS. 4 to 6, an airtight sealed package according to a second embodiment of the invention will be described. FIG. 4 is a sectional view illustrating the state of the airtight sealed package of the second embodiment, which is assumed before pressure adjustment. FIG. 5 is a perspective view illustrating the airtight sealed package of the second embodiment. FIG. 6 is a sectional view illustrating the state of the airtight sealed package of the second embodiment, which is assumed during pressure adjustment.

(Structure)

Referring first to FIGS. 4 and 5, a description will be given of the structure of the airtight sealed package of the second embodiment. In the second embodiment, elements similar to those of the first embodiment are denoted by corresponding reference numbers, and no description is given thereof.

In the second embodiment, a lid 20 is formed of a metal such as kovar, and is provided with no optical window. Since no optical window is provided, the lid 20 does not pass light therethrough. Further, a metal wiring body 21 that connects the outside and inside of the package substrate 5 to each other is provided in the package substrate 5, and serves as an energy transmission section instead of the optical window.

A pressure adjustment unit 22 is formed as a structure obtained by coating a case member 23 that has an uneven surface and is formed of Si or glass, with a metal film 24 formed of, for example, Cr, Ti, Cu or Al that does not contain a gas producing component and is relatively liable to be oxidized, and by further coating the metal film 24 with an inactive metal film 25 formed of, for example, Au. As shown in FIG. 5, a plurality of pressure adjustment units 22 having the same structure as the above are provided in the sealed internal space of the airtight sealed package so that they contact the metal wiring body 21.

In the second embodiment, the pressure adjustment unit 22 has an uneven surface to increase its surface area. However, depending upon the degree of pressure adjustment, the pressure adjustment unit 22 may not have any uneven surface. Further, only a single pressure adjustment unit 22 may be employed as in the first embodiment. Furthermore, the pressure adjustment units 22 may have the same size and/or shape, or may have, for example, different surface areas for enabling the degree of pressure adjustment to be varied.

(Function)

Referring to FIG. 6, a description will be given of the pressure adjustment function of the second embodiment.

Like the airtight sealed package of the first embodiment, the airtight sealed package of the second embodiment is produced by sealing a package in an airtight manner in an airtight sealing device (not shown) that can adjust the interior of the package to a desired degree of vacuum.

If a small amount of gas is introduced from the outside into the sealed internal space 12 because of a reduction in the airtightness of the periphery of the seal member 11, the pressure in the sealed internal space 12 is increased to thereby change the driving performance of the MEMS device 1.

In this case, heat 26 is supplied to the metal wiring body 21 exposed at the outer surface of the package substrate 5, with the result that the heat 26 is transmitted to the pressure adjustment units 22 via the metal wiring body 21. When thermal energy is supplied to the pressure adjustment units 22, the inactive metal film 25 diffuses into the metal film 24 solder alloy 14 and the metal film 24 is exposed to the internal space 12, as in the first embodiment. As this time, the exposed metal film 24 reacts with gas molecules 17 of oxygen and moisture introduced into the internal space 12 to thereby form an oxide film, or absorbs the gas molecules 17. As a result, the number of gas molecules 17 decreases to thereby decrease the pressure. The decrease of the pressure can be adjusted by adjusting the heating temperature and/or time, and/or the surface area of each of the pressure adjustment units 22. By adjusting these factors, the vacuum degree of the sealed internal space 12 can be returned to a desired value.

(Advantages)

As described above, in the second embodiment, even if the sealed internal space 12 of the airtight sealed package is not filled with an inactive gas, such as Ar gas, the degree of vacuum (pressure) of the sealed internal space can be set at a desired value. Further, by virtue of the metal wiring body 21 provided in the package substrate 5, the optical window 10 for supplying energy for pressure adjustment is not necessary. This enables the airtight sealed package to be also applied to a device that has to be protected from outside light or does not need an optical window. Furthermore, during pressure adjustment, energy can be supplied only to the pressure adjustment units 22, and therefore pressure adjustment can be achieved even if a MEMS device having a low thermal resistance is contained in the package, as in the first embodiment.

Yet further, since the pressure adjustment units 22 have uneven surfaces, the surface area per unit area can be set a maximum value, and hence the effect of decreasing the pressure can be improved.

In addition, since a plurality of pressure adjustment units 22 are employed, stepwise pressure adjustment can be realized, or pressure adjustment can be performed a number of times. Namely, if the vacuum degree of the sealed internal space 12 is still changed after pressure adjustment is performed, further pressure adjustment can be performed.

Third Embodiment

Figure 7:
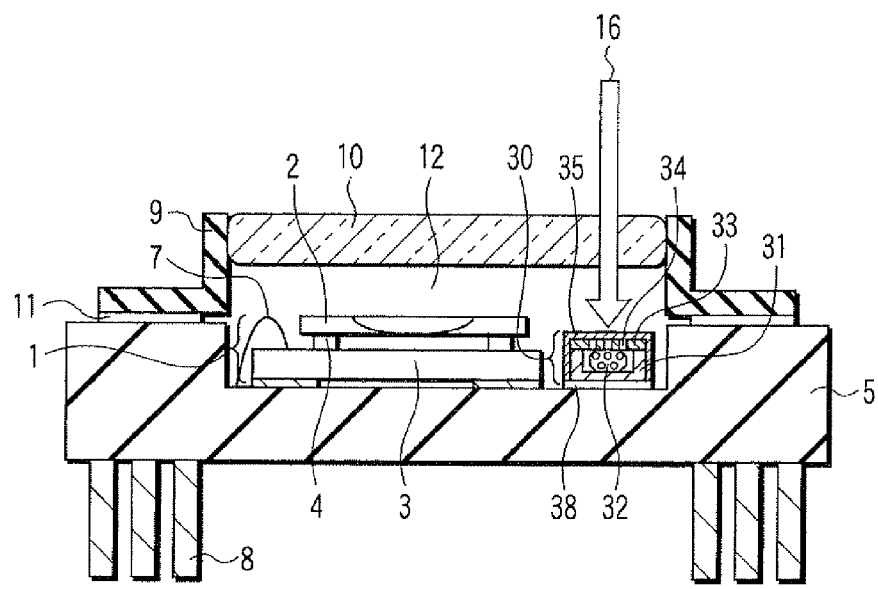
FIG. 7 is a sectional view illustrating the state of an airtight sealed package according to a third embodiment of the invention, which is assumed before pressure adjustment.
Figure 8:
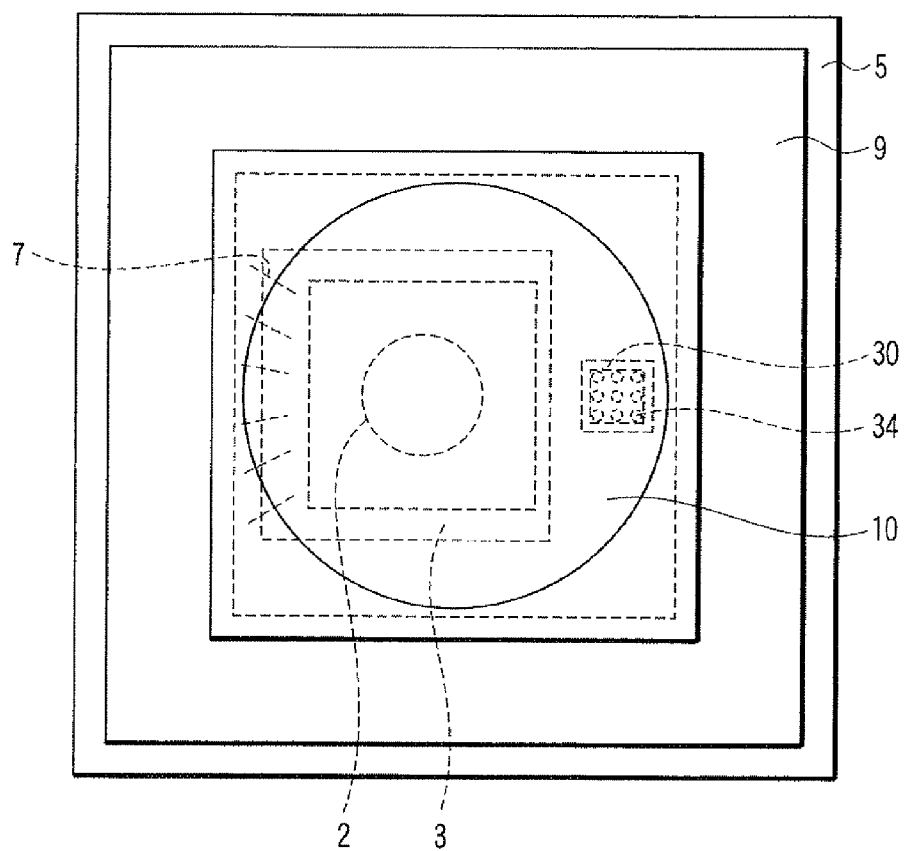
FIG. 8 is a perspective view illustrating the airtight sealed package of the third embodiment.
Figure 9:
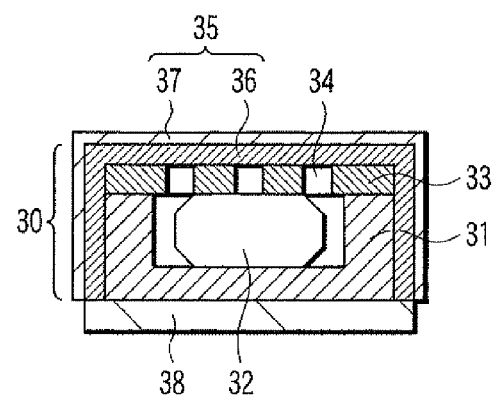
FIG. 9 is a sectional view illustrating a pressure adjustment unit employed in the third embodiment.
Figure 10:
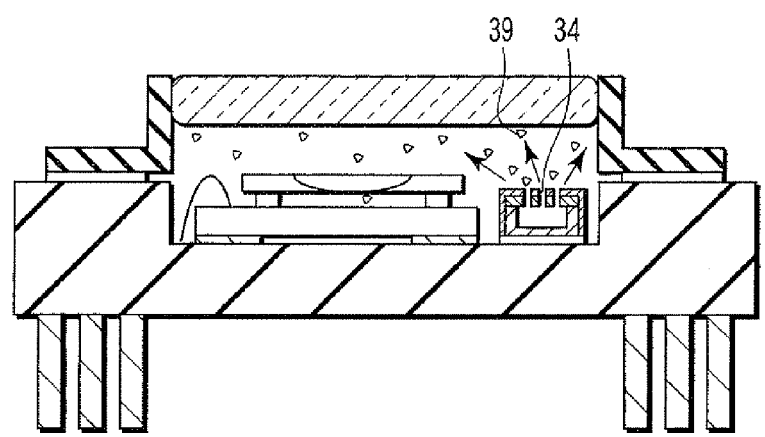
FIG. 10 is a sectional view illustrating the state of the airtight sealed package of the third embodiment, which is assumed during pressure adjustment.
Figure 11:
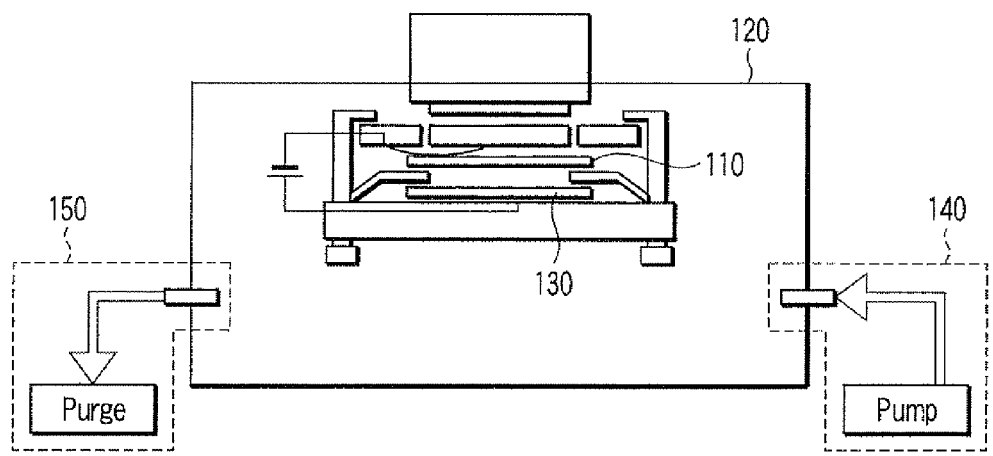
FIG. 11 is a view illustrating a conventional vacuum mounting method and apparatus.

Referring lastly to FIGS. 7 to 10, an airtight sealed package according to a third embodiment of the invention will be described. FIG. 7 is a sectional view illustrating the state of the airtight sealed package of the third embodiment, which is assumed before pressure adjustment. FIG. 8 is a perspective view illustrating the airtight sealed package of the third embodiment. FIG. 9 is a sectional view illustrating a pressure adjustment unit employed in the third embodiment. FIG. 10 is a sectional view illustrating the state of the airtight sealed package of the third embodiment, which is assumed during pressure adjustment.

(Structure)

Referring first to FIGS. 7 to 9, a description will be given of the structure of the airtight sealed package according to the third embodiment. In the third embodiment, elements similar to those of the first embodiment are denoted by corresponding reference numbers, and no description is given thereof.

In the above-described first and second embodiments, pressure adjustment is performed to decrease the pressure of the sealed internal space 12, whereas in the third embodiment, pressure adjustment is performed to increase the pressure of the sealed internal space 12.

In the third embodiment, a pressure adjustment unit 30 comprises a case member 31, gas molecule generator 32, lid member 33 and cover member 35. The pressure adjustment unit 30 is fixed to the package substrate 5 by a coupling member 38 at a position at which the pressure adjustment unit 30 can receive a laser beam 16.

The case member 31 is formed of Si or glass, and has a recess for receiving the gas molecule generator 32. The gas molecule generator 32 is formed of a metal, such as solder, containing a gas generation component, such as fluorinate, $CO_2$, $H_2O$ or flux, that does not evaporate unless a preset temperature is reached. The gas molecule generator 32 is received in the recess formed in the case member 31. The lid member 33 is formed of, for example, Si or glass. The lid member 33 is bonded to the upper surface of the case member 31, and has fine through holes 34 as shown in FIGS. 7 and 8. The cover member 35 is formed by covering the surface of a metal film 36 with an inactive metal film 37 of, for example, gold. The cover member 36 is formed of, for example, solder that melts at a certain temperature or more.

Although in the third embodiment, the pressure adjustment unit 30 has the frame body shown in FIG. 9, it may have, depending upon the degree of pressure adjustment, a relatively simple structure in which the surface of solder alloy containing flux (not shown) with a gas generation component is coated with an inactive metal film.

Further, a plurality of pressure adjustment units 30 may be provided in the sealed internal space 12. A laser beam may be applied to the pressure adjustment unit 30 as in the first embodiment. Alternatively, thermal energy may be supplied to the pressure adjustment unit 30 as in the second embodiment.

(Function)

Referring to FIG. 10, the pressure adjustment function of the third embodiment will be described.

The pressure adjustment function of the third embodiment differs from those of the first and second embodiment in the following points:

Like the airtight sealed packages of the first and second embodiments, the airtight sealed package of the third embodiment is produced by sealing a package in an airtight manner in an airtight sealing device (not shown) that can adjust the interior of the package to a desired degree of vacuum.

After the airtight sealed package is produced, when the MEMS device 1 in the sealed internal space 12 and/or the inner surface of the lid 9 of the package are heated and then cooled, and the surfaces of the components contained in the sealed internal space 12 absorb gas molecules in the space, the pressure of the sealed internal space 12 is decreased to thereby change the driving performance of the MEMS device 1.

In this case, a laser beam 16 is applied from the outside to the pressure adjustment unit 30 through the optical window 10 to supply it with thermal energy that enables the metal film 36 to melt and also enables gas to be produced by the gas molecule generator 32. At this time, the inactive metal film 37 melts and diffuses into the metal film 36 to expose the through holes 34. Gas molecules 39 produced by the gas molecule generator 32 are introduced into the sealed internal space 12 via the through holes 34. The increase of the pressure can be adjusted by adjusting the intensity of the laser beam and/or the time of application of the laser beam, and/or the number of gas molecules contained in the gas molecule generator 32. By adjusting these, the degree of vacuum of the sealed internal space 12 can be returned to a desired value.

(Advantages)

As described above, since in the third embodiment, the gas molecule generator 32 is contained in the pressure adjustment unit 30, pressure adjustment can be performed to increase the pressure of the sealed internal space 12. Further, since energy can be supplied only to the pressure adjustment unit 30 during pressure adjustment as in the first embodiment, pressure adjustment can be achieved even if a MEMS device having a low thermal resistance is contained in the package.

Although pressure adjustment is performed to decrease the pressure in the first and second embodiments, and to increase the same in the third embodiment, these ways of pressure adjustment may be combined.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An airtight sealed package with a device sealed therein in an airtight manner under vacuum, the device being placed in a space defined in the airtight sealed package by a first lid and a substrate, comprising:
    at least one pressure adjustment unit provided on at least one of the first lid and the substrate, and configured to receive energy from an outside of the airtight sealed package, with the device sealed in the airtight manner in the airtight sealed package, to adjust pressure in the space; and
    an energy transmission member which transmits the energy to the pressure adjustment unit, wherein
    the pressure adjustment unit includes a gas generator which generates gas into the space when the energy is received, and
    the pressure adjustment unit is a structure containing a gas generating component, the pressure adjustment unit including:
        a case member having a groove;
        a gas molecule generator received in the groove, and generating gas when a preset temperature is reached;
        a second lid coupled to the case member and having fine through holes which introduce gas generated by the gas molecule generator into the airtight sealed package;
        a metal film covering at least the through holes of the second lid; and
        an inactive metal film covering the metal film.

2. The airtight sealed package according to claim 1, wherein the inactive metal film is formed of gold.

* * * * *